United States Patent
Bar et al.

(10) Patent No.: US 8,397,360 B2
(45) Date of Patent: Mar. 19, 2013

(54) METHOD FOR MANUFACTURING A MONOLITHIC OSCILLATOR WITH BULK ACOUSTIC WAVE (BAW) RESONATORS

(75) Inventors: Pierre Bar, Grenoble (FR); Sylvain Joblot, Valbonne (FR); Jean-Francois Carpentier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 125 days.

(21) Appl. No.: 12/896,394

(22) Filed: Oct. 1, 2010

(65) Prior Publication Data
US 2011/0078894 A1 Apr. 7, 2011

(30) Foreign Application Priority Data

Oct. 1, 2009 (FR) ..................................... 09 56849

(51) Int. Cl.
*H01G 7/00* (2006.01)
(52) U.S. Cl. ....... 29/25.42; 29/592.1; 29/594; 29/609.1; 331/155; 333/150; 333/187; 333/193; 333/195; 333/196; 361/306.1; 438/48; 438/459
(58) Field of Classification Search ................ 29/25.42, 29/592.1, 594, 609.1; 331/155; 361/306.1; 333/150, 187, 193, 195, 196; 438/48, 459
See application file for complete search history.

(56) References Cited

U.S. PATENT DOCUMENTS

| | | | |
|---|---|---|---|
| 4,158,805 A * | 6/1979 | Ballato | ......................... 324/727 |
| 5,864,261 A | 1/1999 | Weber | |
| 6,297,704 B1 * | 10/2001 | Nicholls et al. | .................. 331/34 |
| 6,342,134 B1 | 1/2002 | Barber et al. | |
| 2004/0113720 A1 | 6/2004 | Komuro et al. | |
| 2005/0023932 A1 | 2/2005 | Inoue et al. | |
| 2005/0057117 A1 | 3/2005 | Nakatsuka et al. | |
| 2005/0110598 A1 | 5/2005 | Larson, III | |
| 2007/0279155 A1 | 12/2007 | Uno et al. | |
| 2009/0045703 A1 | 2/2009 | Barber et al. | |
| 2009/0133237 A1 | 5/2009 | Onishi et al. | |
| 2010/0134210 A1 | 6/2010 | Umeda | |
| 2010/0148638 A1 | 6/2010 | Umeda | |
| 2011/0227671 A1 | 9/2011 | Zhang | |

FOREIGN PATENT DOCUMENTS

| | | |
|---|---|---|
| EP | 1489740 A2 | 12/2004 |
| FR | 2888663 B1 | 4/2008 |
| JP | 2005311849 A | 11/2005 |
| JP | 2006229282 A | 8/2006 |

(Continued)

OTHER PUBLICATIONS

Kobayashi, H. et al., "Fabrication of Piezoelectric Thin Film Resonators with Acoustic Quarter-Wave Multilayers," Japanese Journal of Applied Physics, Japan Society of Applied Physics 41(5B) Part 1:3455-3457, May 2002.

(Continued)

*Primary Examiner* — Paul D Kim
(74) *Attorney, Agent, or Firm* — Seed IP Law Group PLLC

(57) ABSTRACT

A method of adjustment on manufacturing of a monolithic oscillator including circuit elements and a BAW resonator, this method including the steps of: a) forming the circuit elements and the resonator and electrically connecting them; b) covering the resonator with a frequency adjustment layer; c) measuring the output frequency of the oscillator; d) modifying the thickness of the frequency adjustment layer to modify the output frequency of the oscillator.

17 Claims, 3 Drawing Sheets

FOREIGN PATENT DOCUMENTS

JP 2006352619 A 12/2006

OTHER PUBLICATIONS

Mourot L. et al., "Band Reject Filter in BAW Technology," Proceedings of the 38th European Microwave Conference, Amsterdam, The Netherlands, Oct. 27-31, 2008, pp. 349-352.

Petit, D. et al., "Thermally Stable Oscillator at 2.5 GHz Using Temperature Compensated BAW Resonator and its Integrated Temperature Sensor," IEEE International Ultrasonics Symposium Proceedings, Beijing, China, Nov. 2-5, 2008, pp. 895-898.

Dossou, S. et al., "60μW SMR BAW Oscillator Designed in 65nm CMOS Technology," IEEE International Symposium on Circuits and Systems, Seattle, Washington, May 18-21, 2008, pp. 1456-1459.

Petit, D. et al., "Temperature Compensated BAW Resonator and Its Integrated Thermistor for a 2.5GHz Electrical Thermally Compensated Oscillator," IEEE Radio Frequency Integrated Circuits Symposium, Boston, Massachusetts, Jun. 7-9, 2009, pp. 339-342.

Reinhardt, A. et al., "Simulation of BAW Resonators Frequency Adjustment," IEEE Ultrasonics Symposium, New York, New York, Oct. 28-31, 2007, pp. 1444-1447.

Bar, P. et al., "Method for Manufacturing a BAW Resonator with a High Quality Factor," U.S. Appl. No. 12/896,361, filed Oct. 1, 2010, 20 pages.

Petit, D. et al. "Method for Manufacturing BAW Resonators on a Semiconductor Wafer," U.S. Appl. No. 12/896,382, filed Oct. 1, 2010, 18 pages.

Lakin et al., "Temperature Compensated Bulk Acoustic Thin Film Resonators," 2000 IEEE Ultrasonics Symposium, pp. 855-858, Oct. 2000.

\* cited by examiner

METHOD FOR MANUFACTURING A MONOLITHIC OSCILLATOR WITH BULK ACOUSTIC WAVE (BAW) RESONATORS

BACKGROUND

1. Technical Field

The present disclosure relates to oscillators using bulk acoustic wave (BAW) resonators. It is more specifically directed to a method for manufacturing monolithic oscillators based on BAW resonators.

2. Description of the Related Art

Oscillators are mainly used in electronic devices to provide clock signals at reference frequencies. Currently, an oscillator comprises oscillating circuit elements and a quartz resonator which enables accurately setting the oscillation frequency.

An alternative to quartz oscillators is the use of oscillators based on BAW resonators. The use of BAW resonators enables to implement higher oscillation frequencies, for example, approximately ranging from a few hundreds of MHz to a few tens of GHz. Lower clock frequencies may also be generated by using, at the oscillator output, a frequency-dividing circuit. Further, BAW resonators have the advantage of having a low bulk and a good quality factor.

It has also been provided to form a monolithic oscillator using a BAW resonator, that is, an oscillator in which the oscillating circuit elements and the resonator are assembled in and on a same integrated circuit chip. The oscillating circuit elements may be formed in and on a semiconductor substrate, for example, a silicon wafer. The BAW resonator is then deposited above this substrate and connected to the oscillating circuit elements. Such an oscillator has the advantage of being very compact and of providing good electric performances.

FIG. 1 is a cross-section view schematically showing a BAW resonator 1 formed on a semiconductor substrate 3. Resonator 1 comprises a resonator core or piezoelectric resonator 5, formed of two electrodes 5a, 5c between which is arranged a layer 5b of a piezoelectric material. When an electric field is created in the piezoelectric layer 5b by application of a potential difference between the two electrodes 5a, 5c, this results in a mechanical disturbance in the form of acoustic waves.

These waves propagate across the resonator thickness. The fundamental resonance establishes when the acoustic wavelength in the piezoelectric material substantially corresponds to twice the thickness of piezoelectric layer 5b. Schematically, a BAW resonator behaves as an on switch at the resonance frequency and as an off switch at a so-called antiresonance frequency.

An acoustic isolation device is provided between the resonant core and the substrate to avoid losing acoustic waves in the substrate. There mainly exist two types of BAW resonators: BAW resonators deposited on a membrane and BAW resonators mounted on a substrate.

BAW resonators deposited on a membrane, such as resonator 1, are better known as FBARs (Film Bulk Acoustic Wave Resonators) or TFRs (Thin Film Resonators). They comprise an air cavity 7 between the resonator core 5 and the substrate 3.

BAW resonators mounted on the substrate, better known as SMRs (Solidly Mounted Resonators), are generally isolated from the substrate by a Bragg mirror.

FIG. 2 shows a simplified electric diagram of an oscillator with a BAW resonator 25. This oscillator comprises various elements of a circuit 23, connected between a high voltage supply terminal $V_{CC}$ and a terminal of low voltage, for example, the ground, and a BAW resonator 25, connected to the circuit elements 23.

Circuit 23 especially comprises active elements capable of sustaining oscillations and of amplifying output signal OUT, and passive elements, for example, capacitors. BAW resonator 25 enables to select the circuit oscillation frequency.

FIG. 3 shows the circuit of FIG. 2, and shows in more detailed fashion circuit elements 23 in the case of a Colpitts oscillator. In this example, circuit elements 23 include a MOS transistor 31 series-connected with a current source 33, between high supply voltage terminal $V_{CC}$ and the ground. Two capacitors 35 and 37 are series-connected between the gate of transistor 31 and the ground. A resistor 39 is connected between high voltage supply terminal $V_{CC}$ and the gate of transistor 31. The terminal common to capacitors 35 and 37 is connected to the drain of transistor 31. BAW resonator 25 is connected between the gate of transistor 31 and the ground. The oscillator output is connected to the source of transistor 31.

The amplification of the output signal and the sustaining of the oscillations are performed by transistor 31 and current source 33. The frequency of output signal OUT is especially linked to the resonance frequency of resonator 25 and to the values of capacitors 35 and 37.

In practice, it is difficult to obtain an oscillation frequency with the desired accuracy.

A first source of inaccuracy is due to the manufacturing dispersions of BAW resonators. Indeed, methods of deposition of the different layers of a BAW resonator do not enable to obtain a resonance frequency at the desired accuracy. Substantial variations of the resonance frequency can especially be observed between resonators formed on a same substrate wafer.

For this reason, as illustrated in FIG. 1, a frequency adjustment layer 9, for example made of silicon nitride, is provided at the surface of resonator 1. The presence of this layer modifies the behavior of the resonator and especially its resonance and antiresonance frequencies. In a manufacturing step, the thickness of layer 9 is adjusted by local etching, for example, by ion etching, to come closer to the resonance frequency.

Despite this adjustment, the accuracy of BAW resonators is not ideal. As an example, for resonance frequencies on the order of 2 GHz, resonance frequency differences on the order of 2 MHz can currently be observed between BAW resonators formed on a same substrate wafer.

A second source of inaccuracy results from the manufacturing dispersions of the elements of circuit 23. Indeed, despite the attention brought to the forming of these elements, behavior differences between circuits formed in and on a same substrate wafer can be observed. This also currently results in dispersions on the order of 2 MHz on the oscillation frequency of the final circuit.

The two above-mentioned sources of inaccuracy may add up, which results in a lack of accuracy of the oscillation frequency of oscillators using BAW resonators, on the order of 4 MHz in the case of the above examples.

To overcome this lack of accuracy, a variable capacitance, for example formed by a network of switched capacitors, is generally provided in circuit 23. The frequency of the output signal of each oscillator can thus be finely corrected in a final calibration step. Currently, this step occurs when the BAW resonator is assembled and connected to circuit 23 and the oscillator is powered.

A disadvantage of this calibration mode is that, to be able to compensate for the above-mentioned significant inaccuracy of the oscillation frequency, a large network of switched capacitors is provided. This results in a degradation of the electric performances of the oscillator, especially linked to the losses due to the unused switched capacitors of the network.

BRIEF SUMMARY

One embodiment of the present disclosure overcomes all or part of the disadvantages of conventional reference oscillators using BAW resonators.

One embodiment of the present disclosure is a method for forming oscillators with a BAW resonator minimizing the inaccuracy of the oscillation frequency.

One embodiment of the present disclosure is a method enabling to minimize or to suppress the calibration switched capacitor network.

One embodiment of the present disclosure is a method which is easy to implement.

Thus, an embodiment of the present disclosure provides a method of adjustment on manufacturing of a monolithic oscillator comprising circuit elements and a BAW resonator, this method comprising the steps of: a) forming the circuit elements and the resonator and electrically connecting them; b) covering the resonator with a frequency adjustment layer; c) measuring the output frequency of the oscillator; d) modifying the thickness of the frequency adjustment layer to modify the output frequency of the oscillator.

According to an embodiment of the present disclosure, step d) is performed by ion etching of the frequency adjustment layer.

According to an embodiment of the present disclosure, the frequency adjustment layer is made of silicon nitride.

According to an embodiment of the present disclosure, the oscillator comprises, between the circuit elements and the output, a frequency divider.

According to an embodiment of the present disclosure, the oscillator output is connected to a test pad provided at the circuit surface.

According to an embodiment of the present disclosure, step c) is carried out by means of a test probe contacting the test pad to measure the oscillation frequency of the output signal.

According to an embodiment of the present disclosure, the connections between the circuit elements and the resonator comprise vias.

According to an embodiment of the present disclosure, the resonator comprises a layer capable of limiting the sensitivity of its resonance frequency to temperature.

According to an embodiment of the present disclosure, the oscillator is of Colpitts type.

According to an embodiment of the present disclosure, a large number of oscillators are formed simultaneously on a same semiconductor wafer.

According to an embodiment of the present disclosure, the output frequency is measured simultaneously for several oscillators of a same wafer.

According to an embodiment of the present disclosure, the thickness of the frequency adjustment layer is modified simultaneously for several oscillators of a same wafer.

BRIEF DESCRIPTION OF THE SEVERAL VIEWS OF THE DRAWINGS

The foregoing features and advantages of the present disclosure will be discussed in detail in the following non-limiting description of specific embodiments in connection with the accompanying drawings.

DETAILED DESCRIPTION

Figure 1:
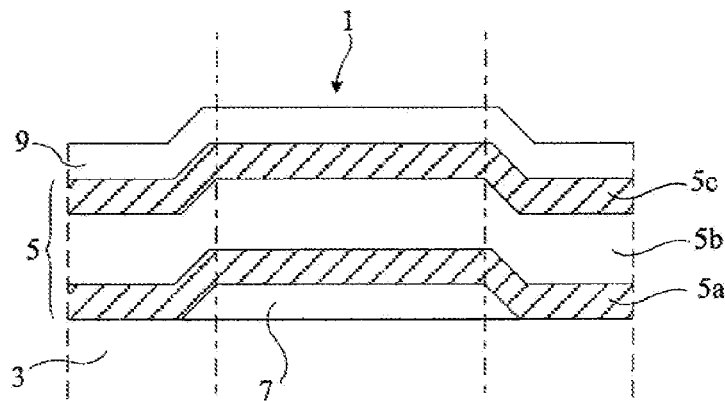
FIG. 1 is a cross-section view schematically showing a known BAW resonator.

For clarity, the same elements have been designated with the same reference numerals in the different drawings and, further, as usual in the representation of microcomponents, the various drawings are not to scale.

Figure 4:
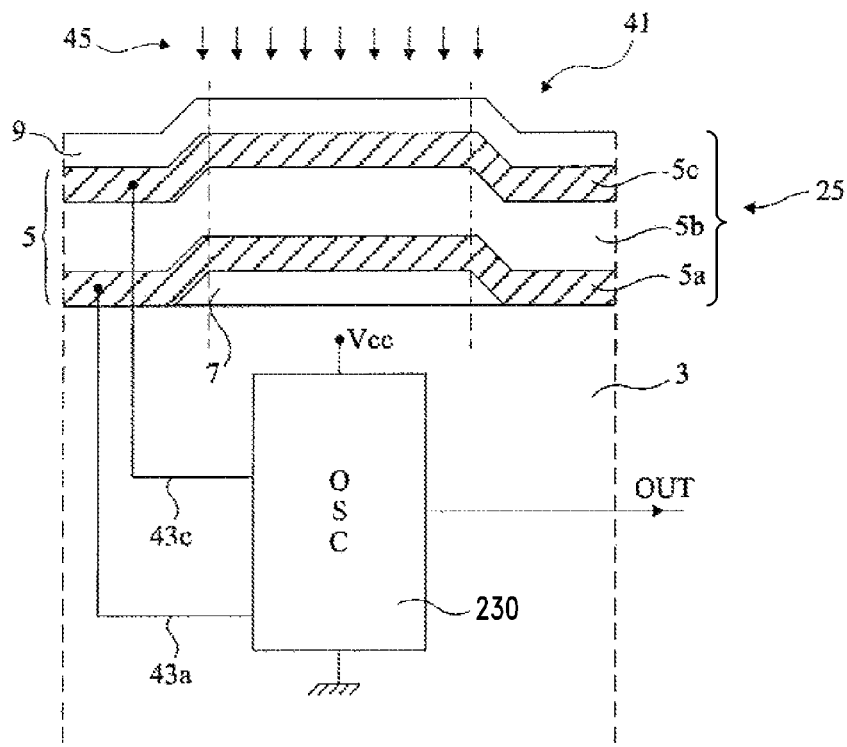
FIG. 4 is a cross-section view schematically illustrating an example of a monolithic oscillator having a BAW resonator according to an embodiment of the present disclosure.
Figure 6:
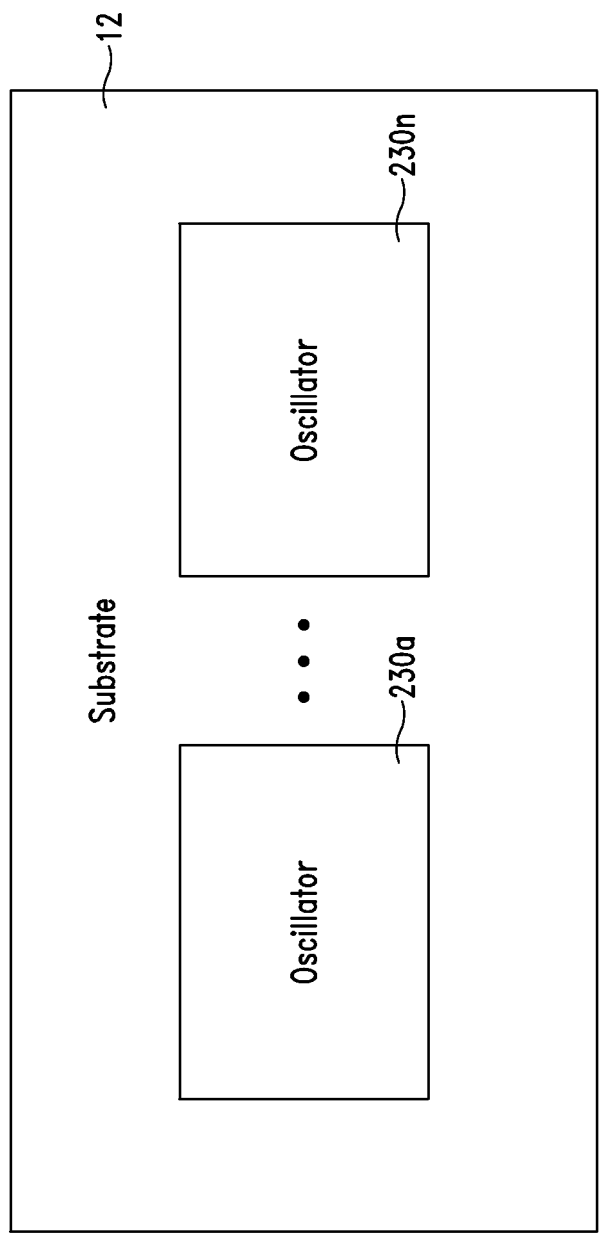
FIG. 6 is a cross-section view of a plurality of oscillators according to an embodiment of the present disclosure.

FIG. 4 is a cross-section view schematically showing an embodiment of a monolithic oscillator 41 using a BAW resonator 25, formed in and on a semiconductor substrate 3. Although FIG. 4 shows a single oscillator, in practice, many oscillators 230a-230n are formed simultaneously inside and on top of a same semiconductor substrate, see FIG. 6

Figure 2:
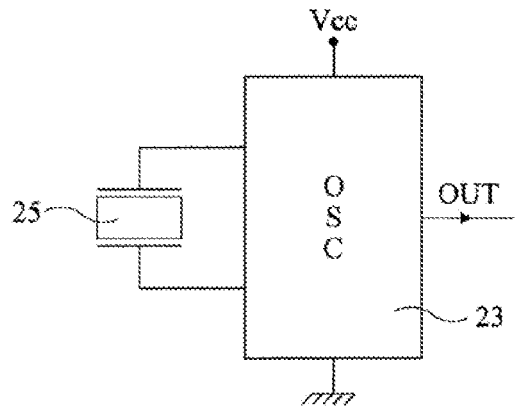
FIG. 2 shows a simplified electric diagram of a known oscillator with a BAW resonator.
Figure 3:
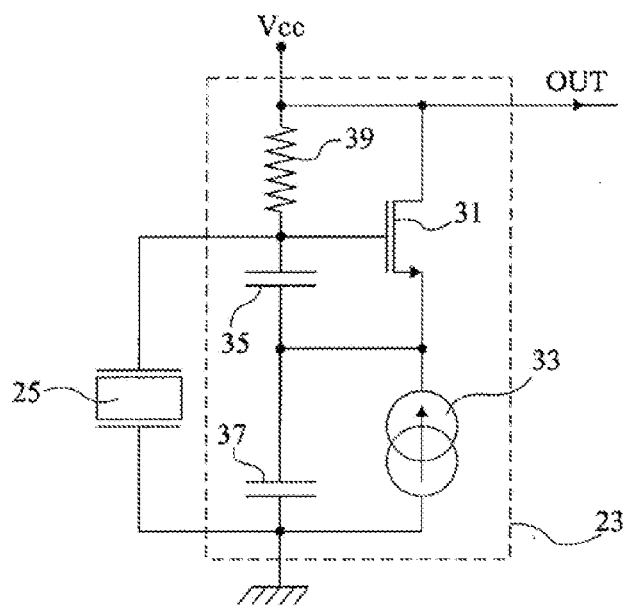
FIG. 3 shows the electric diagram of a known oscillator with a Colpitts-type BAW resonator.

Various elements of and oscillator circuit 230, connected between a terminal of high voltage $V_{CC}$ and a terminal of low voltage, for example, ground, are formed in and on substrate 3. As discussed below, the oscillator circuit 230 of FIG. 4 is similar to the oscillator circuit 23 of FIGS. 2-3, except that the oscillator circuit 230 includes a smaller network of switched capacitors. As an example, elements of a Colpitts-type oscillating circuit, such as described in relation with FIG. 3, may be formed in and on substrate 3.

A BAW resonator 25 is deposited above or next to substrate area 3 inside and on top of which are formed the elements of circuit 230. In this example, BAW resonator 25 is a BAW resonator of suspended type such as described in relation with FIG. 1. Resonator 25 especially comprises a piezoelectric resonator 5 formed of the stacking of a lower electrode 5a, of a piezoelectric layer 5b, and of an upper electrode 5c. Piezoelectric resonator 5 is isolated from substrate 3 by a recess or air cavity 7. Further, BAW resonator 25 has at its surface a frequency adjustment layer 9, for example, a silicon nitride layer.

The electrodes of BAW resonator 25 are connected to circuit 230. These connections are schematically shown by lines 43a and 43c. As an example, connections 43a and 43c comprise vias.

According to an aspect of an embodiment of the present disclosure, it is provided, in a final step of manufacturing of oscillator 41, when connections 43a and 43c are effective and oscillator 41 is powered, to measure the frequency of output signal OUT, and to then modify the thickness of layer 9 by local etching, to come closer to the desired oscillation frequency.

As an example, contact pads and supply pads (not shown), connected to circuit 230, may be provided at the surface of the semiconductor wafer, to be able to supply and test the oscillator by means of test probes. In practice, several oscillators, such as oscillators 230a-230n, of a same wafer may be supplied and tested at once, by the use of a test board comprising a large number of probes, see FIG. 6. Should the desired degree of accuracy allow it, the substrate wafer may be tested by areas, that is, an oscillator of a predefined area may be tested, to deduce the thickness modification to be applied to frequency adjustment layer 9 for all the neighboring oscillators comprised within this area.

Thus, an example of a method for forming oscillator 41 comprises the following steps a) to d):

a) forming the elements of circuit 230 and resonator 25 and electrically connecting them;

b) covering resonator 25 with a frequency adjustment layer 9, for example, made of silicon nitride; this step may be carried out during or after step a);

c) after step b), measuring, when connections 43a and 43c are effective and oscillator 41 is powered, the oscillation frequency of output signal OUT;

d) after step c), modifying the thickness of adjustment layer 9, according to the frequency measured at step c), to modify the output frequency of the oscillator, to come closer to the specified oscillation frequency.

Step d) may advantageously be carried out by ion etching, like the above-described step of adjustment of the resonance frequency of a BAW resonator. As an example, the semiconductor wafer on which the oscillators are formed is scanned by an ion beam 45. The scan speed is controlled to stay longer on the oscillators for which a much greater thickness is desired to be etched.

An iteration of steps c) and d) may be provided if need be. In addition, the method may include forming the resonator by forming a temperature compensation layer configured to limit a sensitivity of the resonance frequency to temperature. The method may also include forming a second oscillator on the substrate simultaneously with the first oscillator, see FIG. 6. In one embodiment, the method also includes measuring an output frequency of the second oscillator simultaneously with measuring the output frequency of the first oscillator. The method may also include modifying a thickness of a frequency adjustment layer on the second oscillator simultaneously with modifying the frequency adjustment layer on the first oscillator.

Figure 5:
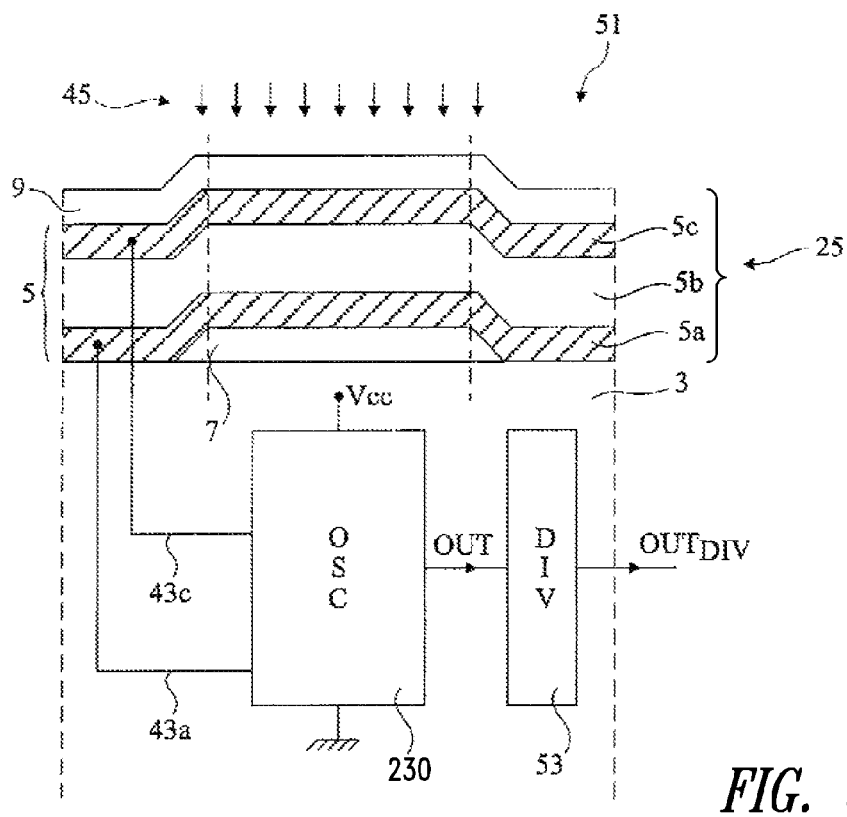
FIG. 5 is a cross-section view in the same plane as FIG. 4 illustrating an alternative embodiment of the method described in relation with FIG. 4.

FIG. 5 is a cross-section view in the same plane as FIG. 4 of an oscillator 51 with a BAW resonator 25, illustrating a variation of the forming method described in relation with FIG. 4.

Unlike oscillator 41 of FIG. 4, oscillator 51 further comprises, inside and on top of semiconductor substrate 3, a frequency divider 53, having an input connected to the output of circuit 230. In operation, divider 53 provides at an output a low-frequency oscillating signal $OUT_{DIV}$ related to output signal OUT of circuit 230.

In this example, the oscillation frequency, corresponding to above-mentioned steps c) and d), is adjusted based on the measurement of low-frequency oscillating signal $OUT_{DIV}$.

According to an advantage of the above-described method examples, the accuracy of the oscillation frequency is improved by a factor on the order of two with respect to usual manufacturing methods. Indeed, it has here been provided to correct in a same step of etching of a frequency adjustment layer the errors due to the manufacturing dispersions of BAW resonators and those due to the oscillating circuit elements. The only source of inaccuracy of the oscillation frequency is thus linked to the fineness of the frequency adjustment method by local etching. As an example, it is smaller than 2 MHz for oscillation frequencies on the order of 2 GHz.

It can thus advantageously be provided to decrease the size of the network of switched capacitors used to correct the oscillation frequency drift of the circuit. Should the accuracy of the method of frequency adjustment by local etching allow it, it may advantageously be provided to suppress the network of switched capacitors.

Specific embodiments of the present disclosure have been described. Various alterations and modifications will occur to those skilled in the art.

In particular, although the present disclosure mainly mentions oscillators with a suspended BAW resonator, it will be within the abilities of those skilled in the art to implement the desired operation by using SMR-type BAW resonators.

Further, the operation of BAW resonators has been described hereabove in very simplified fashion. The present disclosure is not limited to this description. In particular, other layers may be provided in the stack forming a BAW resonator. A layer capable of compensating the resonance frequency variations may especially be provided.

Moreover, the present disclosure is not limited to the use of silicon nitride to form the frequency adjustment layer at the surface of the BAW resonator. It will be within the abilities of those skilled in the art to use other adapted materials, for example, silicon oxide, molybdenum, or aluminum.

Further, the present disclosure is not limited to the use of a local ion beam to modify the thickness of the frequency adjustment layer. It will be within the abilities of those skilled in the art to implement the desired operation by using other adapted etch methods.

Moreover, the example of a Colpitts-type oscillating circuit has been mentioned hereabove. The present disclosure is not limited to this specific case. A Pierce oscillator or any other adapted oscillating circuit may for example be provided.

Such alterations, modifications, and improvements are intended to be part of this disclosure, and are intended to be within the spirit and the scope of the present disclosure. Accordingly, the foregoing description is by way of example only and is not intended to be limiting.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a first oscillator on a substrate, the first oscillator having an output;
    forming a resonator on the substrate, the resonator being electrically coupled to the first oscillator;
    forming a frequency adjustment layer on the resonator;
    measuring an output frequency on the output of the first oscillator; and
    adjusting the output frequency of the first oscillator by modifying a thickness of the frequency adjustment layer.

2. The method of claim 1, wherein the modifying is performed by ion etching of the frequency adjustment layer.

3. The method of claim 1, wherein the frequency adjustment layer includes silicon nitride.

4. The method of claim 1, wherein forming the first oscillator includes forming a plurality of circuit elements and forming a frequency divider between the plurality of circuit elements and the output.

5. The method of claim 1, further comprising forming a test pad coupled to the output of the first oscillator.

6. The method of claim 5, wherein the measuring includes contacting a test probe to the test pad to measure the output frequency of the first oscillator.

7. The method of claim 1, wherein forming the resonator electrically coupled to the first oscillator includes forming a plurality of connections between the first oscillator and the resonator, the connections including respective vias.

8. The method of claim 1, wherein forming the resonator includes forming a temperature compensation layer configured to limit a sensitivity of the resonance frequency to temperature.

9. The method of claim 1, wherein the first oscillator is a Colpitts oscillator.

10. The method of claim 1, further comprising forming a second oscillator on the substrate simultaneously with the first oscillator.

11. The method of claim 10, further comprising measuring an output frequency of the second oscillator simultaneously with measuring the output frequency of the first oscillator.

12. The method of claim 10, further comprising modifying a thickness of a frequency adjustment layer on the second oscillator simultaneously with modifying the frequency adjustment layer on the first oscillator.

13. A method, comprising:
    forming an oscillator having a first input, a second input, and an output on a substrate, the oscillator being configured to generate a first frequency value, the forming including:
    forming a bulk acoustic wave resonator on the substrate, the resonator having a first electrode coupled to the first input of the oscillator and a second electrode coupled to the second input of the oscillator;
    forming an adjustment layer on the resonator;
    forming a test pad on the substrate, the test pad being coupled to the output of the oscillator;
    measuring an output frequency of the oscillator through the test pad; and
    reducing a thickness of the adjustment layer until the output frequency is the first frequency value.

14. The method of claim 13 wherein the reducing includes ion etching the adjustment layer.

15. The method of claim 13, wherein the adjustment layer includes silicon nitride.

16. The method of claim 13, wherein forming the oscillator includes forming a plurality of circuit elements and forming a frequency divider between the plurality of circuit elements and the output.

17. The method of claim 13, wherein the oscillator is a Colpitts oscillator.

* * * * *